(12) United States Patent
Fuke et al.

(10) Patent No.: US 10,420,250 B2
(45) Date of Patent: Sep. 17, 2019

(54) SHUTTER UNIT AND ELECTRONIC APPARATUS

(71) Applicant: FUJITSU LIMITED, Kawasaki-shi, Kanagawa (JP)

(72) Inventors: Kazuya Fuke, Yokohama (JP); Yoshiyuki Sato, Yokohama (JP)

(73) Assignee: FUJITSU LIMITED, Kawasaki (JP)

( * ) Notice: Subject to any disclaimer, the term of this patent is extended or adjusted under 35 U.S.C. 154(b) by 43 days.

(21) Appl. No.: 15/233,169

(22) Filed: Aug. 10, 2016

(65) Prior Publication Data
US 2017/0055368 A1 Feb. 23, 2017

(30) Foreign Application Priority Data
Aug. 19, 2015 (JP) .................. 2015-162172

(51) Int. Cl.
*H05K 7/20* (2006.01)

(52) U.S. Cl.
CPC ..... *H05K 7/20145* (2013.01); *H05K 7/20581* (2013.01)

(58) Field of Classification Search
CPC .. H05K 7/20145; H05K 7/20581; F16K 3/04; F24F 13/15; F24F 13/1413; F24F 13/14
USPC ...................................... 454/184
See application file for complete search history.

(56) References Cited

U.S. PATENT DOCUMENTS

| 4,497,241 A * | 2/1985 | Ohkata | F24F 13/1426 454/258 |
| 4,962,882 A * | 10/1990 | Sarazen, Jr. | F24F 13/15 236/49.5 |
| 6,142,866 A * | 11/2000 | Wright | H05K 7/20209 165/122 |
| 6,953,320 B1 * | 10/2005 | Davis | A01K 1/0052 415/147 |

(Continued)

FOREIGN PATENT DOCUMENTS

| JP | 5-66456 | 9/1993 |
| JP | 6-78741 | 11/1994 |

(Continued)

OTHER PUBLICATIONS

Japanese Office Action dated Feb. 19, 2019 from Japanese Patent Application No. 2015-162172, 8 pages.

(Continued)

*Primary Examiner* — Steven B McAllister
*Assistant Examiner* — Allen R Schult
(74) *Attorney, Agent, or Firm* — Staas & Halsey LLP

(57) ABSTRACT

A shutter unit includes a plurality of shutters that are grouped into groups corresponding to one of a plurality of fans, the grouped shutters being arranged beside one another and positioned on a leeward side or a windward side of the corresponding one of the plurality of fans, the grouped shutters being capable of pivoting between an open position and a closed position, the plurality of fans being for sending wind to an inside of an electronic apparatus casing; a coupling member that couples the grouped shutters together (Continued)

so that the grouped shutters are pivotable; and a retaining member that retains the grouped shutters in a state of being in the open position and inclined with respect to a flow direction of returning wind returning from the inside of the electronic apparatus casing toward a side of the plurality of fans.

14 Claims, 17 Drawing Sheets

(56) References Cited

U.S. PATENT DOCUMENTS

2004/0129410 A1* 7/2004 Soderlund .......... H05K 7/20181
    165/120
2011/0175007 A1* 7/2011 Sato ................... H05K 7/20172
    251/301
2011/0259550 A1* 10/2011 Komaba ................ F16K 1/222
    165/96
2012/0051890 A1* 3/2012 Shirakami ............. F04D 25/166
    415/146

FOREIGN PATENT DOCUMENTS

| JP | 8-338649 | 12/1996 |
| JP | 2011-231954 | 11/2011 |
| JP | 2012-49215 | 3/2012 |

OTHER PUBLICATIONS

Japanese Office Action dated Jun. 4, 2019 from Japanese Patent Application No. 2015-162172, 5 pages.

* cited by examiner

SHUTTER UNIT AND ELECTRONIC APPARATUS

CROSS-REFERENCE TO RELATED APPLICATION

This application is based upon and claims the benefit of priority of the prior Japanese Patent Application No. 2015-162172, filed on Aug. 19, 2015, the entire contents of which are incorporated herein by reference.

FIELD

The embodiments discussed herein are related to a shutter unit and an electronic apparatus.

BACKGROUND

Techniques are disclosed, by which a plurality of flaps included in a wind pressure type shutter unit are positioned approximately in parallel to the direction of a passage so that the passage enters an open state and when reverse wind from an air outlet is caused by a fan failure, the flaps slightly inclined with respect to the direction of the passage receive the pressure of the reverse wind and close the passage.

Other techniques, by which a large number of shutter plates are coupled together by a coupling member and all of the shutter plates are caused to swing approximately concurrently, are disclosed.

Further, techniques are disclosed, by which three shutters are coupled together by a shutter coupling member and caused to perform opening and closing operations in the interlocking relationship with one another.

Japanese Laid-open Patent Publication No. 2011-231954, Japanese Unexamined Utility Model Registration Application Publication No. 6-78741, and Japanese Laid-open Patent Publication No. 8-338649 are examples of related art.

SUMMARY

According to an aspect of the invention, a shutter unit includes a plurality of shutters that are grouped into groups corresponding to one of a plurality of fans, the grouped shutters being arranged beside one another and positioned on a leeward side or a windward side of the corresponding one of the plurality of fans, the grouped shutters being capable of pivoting between an open position and a closed position, the plurality of fans being for sending wind to an inside of an electronic apparatus casing; a coupling member that couples the grouped shutters together so that the grouped shutters are pivotable; and a retaining member that retains the grouped shutters in a state of being in the open position and inclined with respect to a flow direction of returning wind returning from the inside of the electronic apparatus casing toward a side of the plurality of fans.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENTS

In a structure where a member to be cooled inside an electronic apparatus casing is cooled by wind generated by a plurality of fans, when a state where part of the fans is stationary occurs, the cooling target is cooled with the other fans that are driven.

In a structure where a plurality of shutters are provided between a fan and the inside of an electronic apparatus casing, when shutters corresponding to a stationary fan are open, wind inside the electronic apparatus casing may escape from the open portion of the shutters. Thus, it is desirable to close the shutters corresponding to the stationary fan. For example, when the shutters corresponding to the stationary fan are caused to pivot in the closing direction by utilizing wind that returns to the shutters from the inside of the electronic apparatus casing, which is hereinafter referred to as "returning wind", a driving source for closing the shutters is undesired.

When, however, the wind that flows to the open portion of the shutters from the inside of the electronic apparatus casing has unevenness, it is difficult to securely close the plurality of shutters corresponding to the stationary fan.

As an aspect, the techniques disclosed in the present application are aimed at securely closing a plurality of shutters corresponding to a stationary fan, which is part of a plurality of fans and has stopped, even when returning wind that flows from the inside of an electronic apparatus casing and hits the plurality of shutters corresponding to the stationary fan has unevenness.

A first embodiment is described in detail with reference to the drawings.

Figure 1:
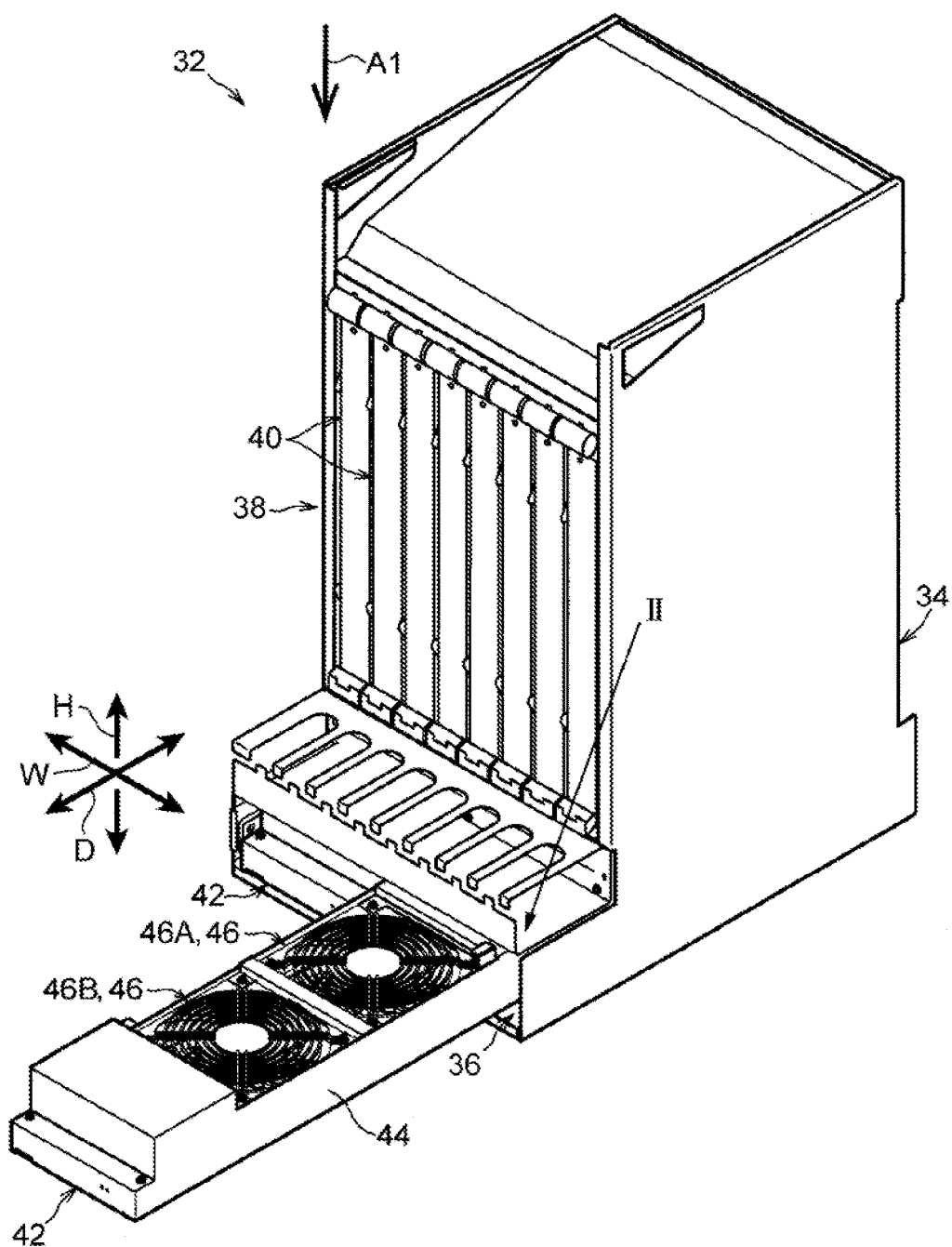
FIG. 1 is a perspective view that illustrates an electronic apparatus according to a first embodiment.

As illustrated in FIG. 1, an electronic apparatus 32 according to the first embodiment includes an electronic apparatus casing 34. In the example illustrated in FIG. 1, the electronic apparatus casing 34 is a member shaped like a box that is a rectangular parallelepiped. Hereinafter, arrows W, D, and H indicate the width direction, the depth direction, and the height direction of the electronic apparatus casing 34, respectively.

Examples of the electronic apparatus 32 include a server and a communication apparatus. In particular, a typical example of the electronic apparatus 32 is an apparatus that is operated continuously over a long period without stopping during 24 hours.

A face on the front side of the electronic apparatus casing 34 is open. A fan unit insertion portion 36 is positioned in a lower portion of the electronic apparatus casing 34. A fan unit 42 is inserted into the fan unit insertion portion 36 from the front side.

In the present embodiment, a plurality of fan units 42, the number of which is two in the example illustrated in FIG. 1, are inserted into the fan unit insertion portion 36 so as to be arranged beside each other in the width direction (the direction of arrow W).

In the electronic apparatus casing 34, a board unit accommodation portion 38 is positioned above the portion into which the fan units 42 are inserted. The board unit accommodation portion 38 is an example of the inside of the electronic apparatus casing 34.

In the board unit accommodation portion 38, a plurality of board units 40 are accommodated beside one another in the width direction (the direction of arrow W). Various electronic components, such as a processor or a memory chip, are mounted over each board unit 40. The electronic components are cooled (air-cooled) by the wind from the fan units 42.

An air outlet, which is not illustrated, is provided in an upper portion of the back face of the electronic apparatus casing 34. When fans 46 are driven, the air that flows into the board unit accommodation portion 38 (to the inside of the electronic apparatus casing 34) is caused to escape from the air outlet.

The fan unit 42 includes a unit frame 44, which is shaped like a rectangle when viewed from above in the direction of arrow A1. The unit frame 44 is an example of a casing of the fan unit 42, that is, a fan casing.

Figure 2:
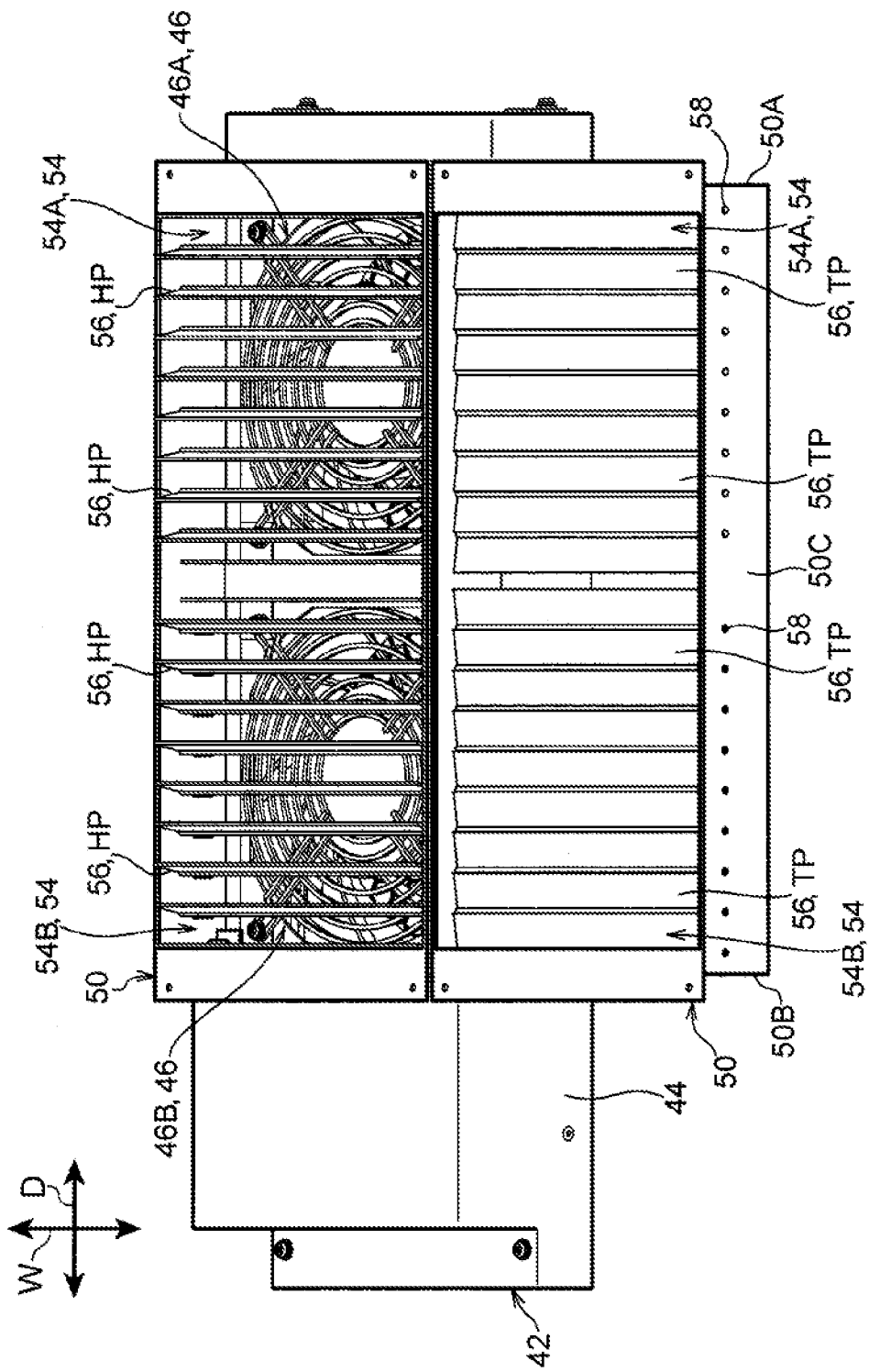
FIG. 2 is a view based on arrow II in FIG. 1, which illustrates fan units and shutter units according to the first embodiment.
Figure 3:
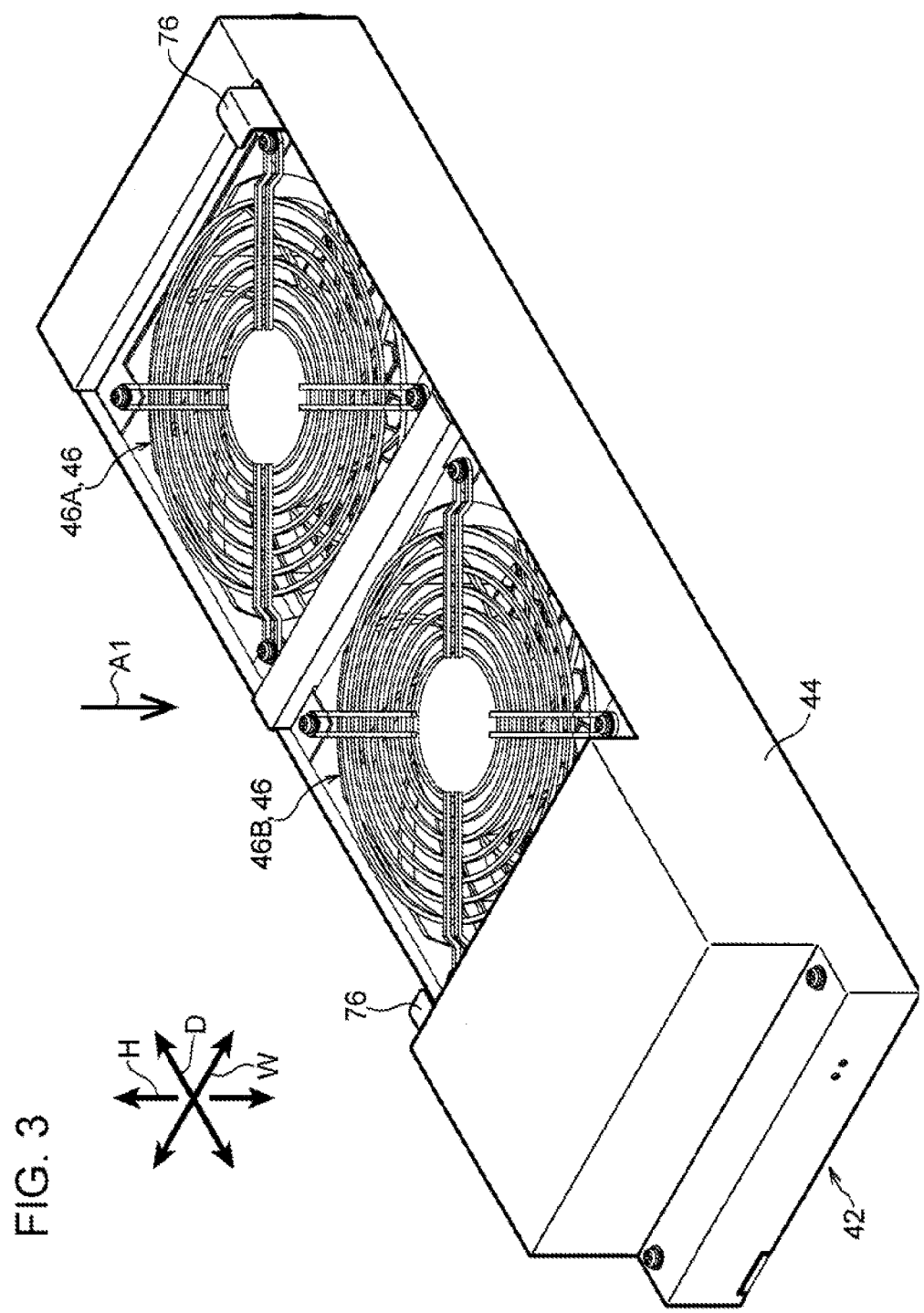
FIG. 3 is a perspective view that illustrates the fan unit according to the first embodiment.

As also illustrated in FIGS. 2 and 3, inside the unit frame 44, a plurality of fans, 46, the number of which is two in the example illustrated in FIGS. 1 to 3, are arranged beside each other in the depth direction (the direction of arrow D). Hereinafter, the two fans 46 may be distinguished as the "back side fan 46A" and the "front side fan 46B" when appropriate. When the fans 46 are driven, wind that flows upward is generated. The fan units 42 (the fans 46) are positioned on the side where air is taken into the board unit accommodation portion 38. In this regard, the fan 46 according to the first embodiment may be referred to as an air intake fan.

In the present embodiment, as described above, the two fan units 42 are provided in the fan unit insertion portion 36. Accordingly, in the electronic apparatus casing 34, four fans 46 in total are arranged in two rows in each of the depth and the width directions. FIG. 2 illustrates a state where two frame bodies 50, described below, are arranged beside each other in the width direction, while one of the two fan units 42 arranged in the width direction is in the state of being drawn out of the fan unit insertion portion 36 and thus is not depicted.

Figure 4:
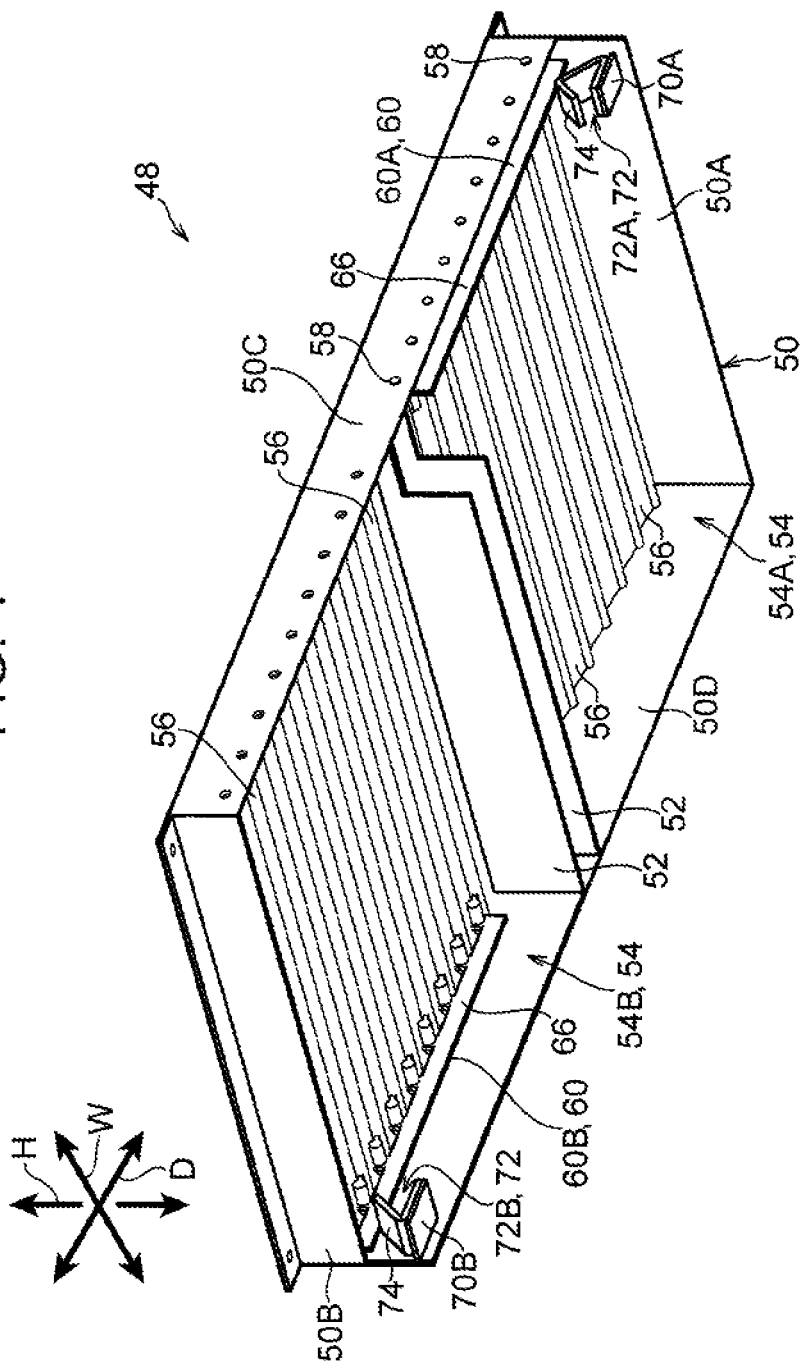
FIG. 4 is a perspective view that illustrates the shutter unit according to the first embodiment.

A shutter unit 48 illustrated in FIG. 4 is arranged between the fan unit insertion portion 36 and the board unit accommodation portion 38, that is, on the leeward side of the fans 46. The shatter unit 48 is illustrated in FIG. 4 as seen from the underside of the shutter unit 48.

The shutter unit 48 includes the frame body 50, which is shaped like a rectangle when viewed from above in the direction of arrow A1. Hereinafter, four walls that form the frame body 50 are referred to as a back wall 50A, a front wall 50B, a right wall 50C, and a left wall 50D. In the present embodiment, the frame bodies 50 are provided so as to correspond to the fan units 42 on a one-by-one basis.

Two partition walls 52 are provided in parallel at approximately midpoint positions in the depth direction between the right wall 50C and the left wall 50D of the frame body 50. The inside of the frame body 50 is partitioned into two opening portions 54 by the partition walls 52. Hereinafter, the two opening portions 54 may be distinguished as the "back side opening portion 54A" and the "front side opening portion 54B" when appropriate.

The back side opening portion 54A corresponds to the back side fan 46A and the wind caused by driving the back side fan 46A flows toward the back side opening portion 54A. Similarly, the front side opening portion 54B corresponds to the front side fan 46B and the wind caused by driving the front side fan 46B flows toward the front side opening portion 54B.

In the back side opening portion 54A and the front side opening portion 54B, a plurality of shutters 56 are arranged beside one another in the depth direction (the direction of arrow D) so as to correspond to each of the fans 46. In the present embodiment, each of the shutters 56 is an approximately rectangular plate member and the longitudinal direction of the shutters 56 accords with the width direction (the direction of arrow W) of the electronic apparatus casing 34.

Each shutter 56 of one of the fan units 42 and each corresponding shutter 56 of the other fan unit 42 include a pair of shafts 58, which project from both ends of the electronic apparatus casing 34 in the width direction. The shafts 58 enable the respective shutters 56 to be supported so as to be pivotable with respect to the right wall 50C and the left wall 50D. Accordingly, each of the plurality of shutters 56 pivots between a closed position TP illustrated in FIG. 6 and an open position HP illustrated in FIG. 7.

Figure 7:
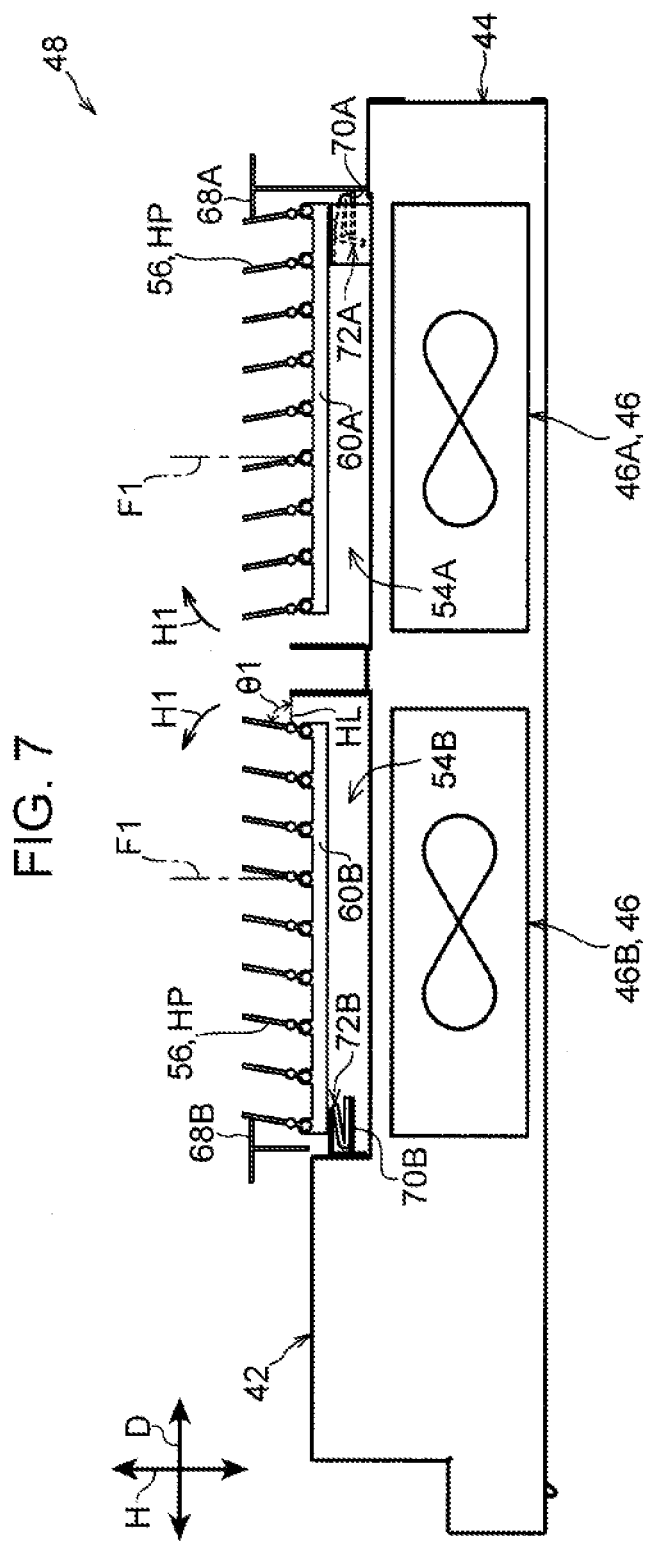
FIG. 7 is a side view that illustrates a state where, in the first embodiment, the fan unit is inserted in the electronic apparatus casing and fans are driven.

Herein, as illustrated in FIG. 7, an angle of each shutter 56 with respect to a horizontal plane HL is defined as a rotation angle $\theta 1$, which increases as plus degrees toward the open position HP. The rotation angle $\theta 1$ approaches zero degrees as the shutters 56 come into the closed position TP and approaches 90 degrees as the shutters 56 come into the open position HP. In no cases in the present embodiment, the rotation angle θ1 becomes zero degrees or less, or becomes 90 degrees or more.

Figure 5:
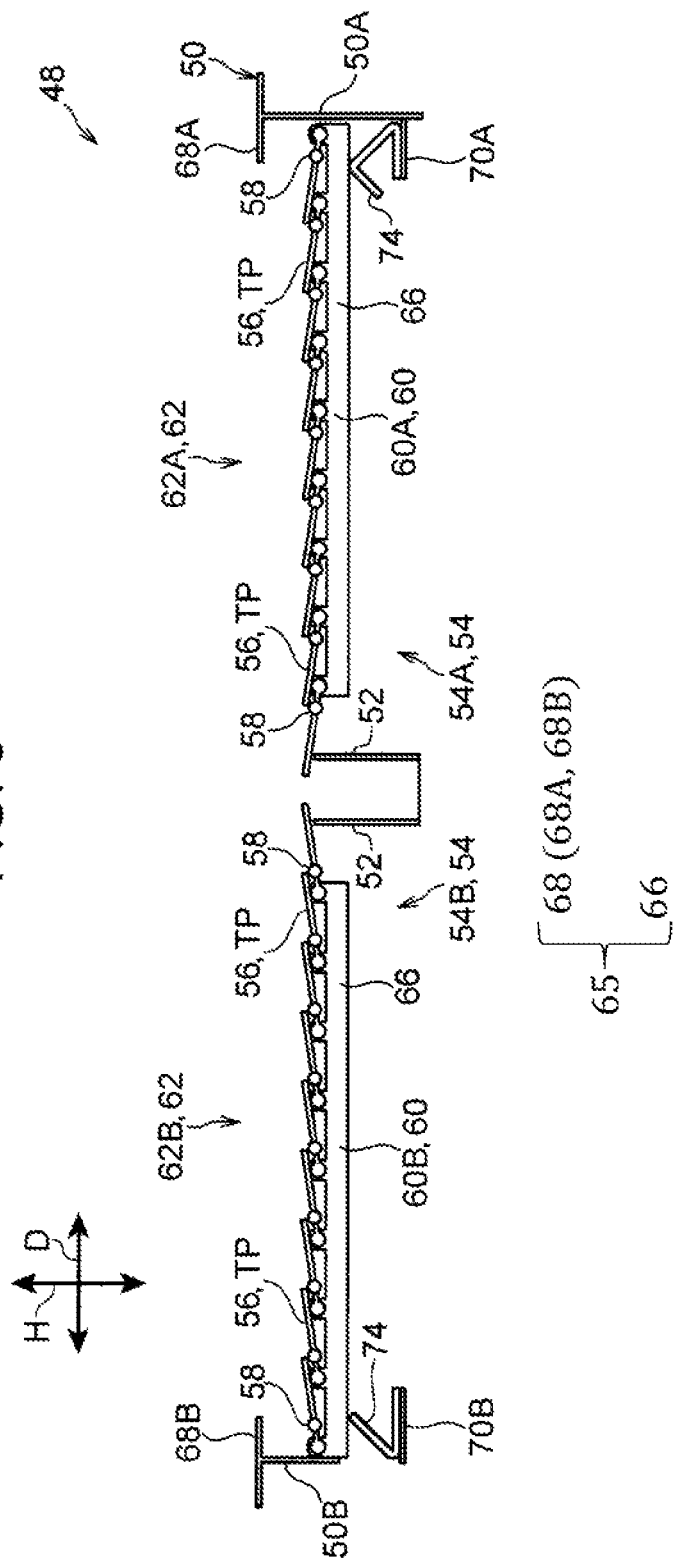
FIG. 5 is a side view that illustrates the shutter unit according to the first embodiment in a closed position of shutters.

As illustrated in FIGS. 4 and 5, the plurality of shutters 56 are coupled together by a coupling member 60 so as to correspond to each fan 46 and a shutter set 62 is formed. Hereinafter, the two coupling members 60 may be distinguished as the "back side coupling member 60A" and the "front side coupling member 60B" when appropriate. Further, when appropriate, the set of the shutters 56 coupled together by the back side coupling member 60A may be distinguished as the "back side shutter set 62A" and the set of the shutters 56 coupled together by the front side coupling member 60B may be distinguished as the "front side shutter set 62B".

The coupling member 60 is a plate-like or rod-like member, which extends in the depth direction (the direction of arrow D) of the electronic apparatus casing 34, and couples the shutters 56 together via coupling pins so that the shutters 56 are pivotable.

The plurality of shutters 56 coupled together by the coupling member 60 pivot in the interlocking relationship with one another. In the present embodiment, in each shutter set 62 coupled together by the coupling member 60, the direction along the shorter width of each of the shutters 56 are aligned so that the rotation angles θ1 of the shutters 56 are substantially identical.

As illustrated in FIG. 4, the back side coupling member 60A is positioned near the right wall 50C. The front side coupling member 60B is positioned near the left wall 50D. That is, the coupling members 60 are both positioned so as to avoid the ranges in which the wind from the fans 46 flows.

In the present embodiment, the coupling member 60 has a certain mass and serves as a weight member 66. In the state where the shutters 56 receive no wind, the "certain mass" is a mass that applies rotating force for causing the shutters 56 to pivot in the opening direction (the direction of the arrow H1 indicated in FIG. 7) to each shutter 56 using the gravity that acts on the coupling member 60. Further, as described below, in the state where the fan 46 that corresponds to certain one of the shutter sets 62 is stationary and the other fans 46 are driven, wind (following wind) that flows upward from the stationary fan, also denoted as 46S, does not occur. However, wind from the other fans 46 that are driven hits the shutters 56 as wind (returning wind) that reversely flows downward from the board unit accommodation portion 38. In the state where part of the fans 46 is stationary as described above, the above-mentioned "certain mass" is a mass that enables the rotating force in the closing direction (the direction of arrow T1 indicated in FIG. 8), which the shutters 56 corresponding to the stationary fan 46 receive from the returning wind to cause the shutters 56 to pivot in the closing direction.

In the present embodiment, the plurality of shutters 56 are coupled together by the coupling member 60 to form the shutter set 62. The mass of the coupling member 60 is set so that the shutters 56 of the shutter set 62 corresponding to the stationary fan 46 may receive the returning wind and pivot in the closing direction.

In actuality, the rotating force of each of the shutters 56 may not only be the rotating force received from the coupling member 60 but may also be the rotating force caused by the gravity applied on the shutters 56 themselves. In determining the mass of the coupling member 60, it is desirable to take into account the rotating force caused by the gravity of the shutters 56 themselves.

In the present embodiment, as illustrated in FIG. 7, the shutters 56 of the back side shutter set 62A and the shatters 56 of the front side shutter set 62B pivot in opposite directions when opening and closing.

Each of the shutters 56 is retained by a retaining member 65 in the open position HP when being in the open position HP.

The retaining member 65 includes the above-described weight member 66 and a contact segment 68. In the present embodiment, the contact segment 68 includes a back side contact segment 68A corresponding to the shutters 56 of the back side shutter set 62A and includes a front side contact segment 68B corresponding to the shutters 56 of the front side shutter set 62B.

As illustrated in FIGS. 5 to 8, the back side contact segment 68A is provided at an upper end of the back wall 50A of the frame body 50 and the front side contact segment 68B is provided at an upper end of the front wall 50B of the frame body 50. The contact segment 68 is an example of a pivoting stopping member.

When the shutters 56 of the back side shutter set 62A pivot in the opening direction (the direction of arrow H1) as illustrated in FIG. 7, the shutter 56 closest to the back wall 50A comes into contact with the back side contact segment 68A. That is, when each shutter 56 of the back side shutter set 62A pivots in the opening direction, the pivoting is stopped by the back side contact segment 68A. Accordingly, each shutter 56 of the back side shutter set 62A is retained in a position inclined with respect to the flow direction of the returning wind from the board unit accommodation portion 38, which is indicated by alternate long and short dashed lines F1, that is, each shutter 56 of the back side shutter set 62A is retained in the open position HP.

Similarly, when the shutters 56 of the front side shutter set 62B pivot in the opening direction (the direction of arrow H1), the shutter 56 closest to the front wall 50B comes into contact with the front side contact segment 68B. That is, when each shutter 56 of the front side shutter set 62B pivots in the opening direction, the pivoting is stopped by the front side contact segment 68B. Accordingly, each shutter 56 of the front side shutter set 62B is retained in a position inclined with respect to the flow direction of the returning wind from the board unit accommodation portion 38, which is indicated by alternate long and short dashed lines F1, that is, each shutter 56 of the front side shutter set 62B is retained in the open position HP.

In contrast, as illustrated in FIG. 5, in the state where the shutters 56 are in the closed position TP, the shutters 56 are in contact with the adjacent shutters 56 and the pivoting in the closing direction is stopped.

As illustrated in FIGS. 4 and 5, the back wall 50A and the left wall 50D of the frame body 50 are provided with bed plates 70A and 70B, respectively. Stopper springs 72A and 72B are fixed to the bed plates 70A and 70B, respectively. Specifically, a back side stopper spring 72A is fixed onto the bed plate 70A. A front side stopper spring 72B is fixed onto the bed plate 70B.

The back side stopper spring 72A exerts spring force in the closing direction (upward) on the back side coupling member 60A. When the back side coupling member 60A moves in the closing direction, the shutters 56 coupled together by the back side coupling member 60A are caused to pivot in the closing direction.

Similarly, the front side stopper spring 72B exerts spring force in the closing direction (upward) on the front side coupling member 60B. When the front side coupling member 60B moves in the closing direction, the shutters 56 coupled together by the front side coupling member 60B are caused to pivot in the closing direction.

On each front side of the back side stopper spring 72A and the front side stopper spring 72B, a tapered face 74 is formed, which is inclined upward toward the back side.

As illustrated in FIG. 3, the fan units 42 are provided with two projecting parts 76. Each of the projecting parts 76 comes into contact with the tapered face 74 before the fan unit 42 is completely inserted in the fan unit insertion portion 36. When the fan unit 42 is inserted in the fan unit insertion portion 36, the projecting parts 76 press the back side stopper spring 72A and the front side stopper spring 72B from the upside and, as illustrated in FIG. 7, cause the back side stopper spring 72A and the front side stopper spring 72B to be separated from the back side coupling member 60A and the front side coupling member 60B. Accordingly, the spring force of the back side stopper spring 72A and the spring force of the front side stopper spring 72B are no longer exerted on the corresponding back side coupling member 60A and the corresponding front side coupling member 60B.

In the state where the fan unit 42 is inserted in the fan unit insertion portion 36, the back side stopper spring 72A, the front side stopper spring 72B, and the two projecting parts 76 are all positioned so as to avoid (the passage of) the wind that flows from the fans 46. Specifically, while portions through which the wind flows out from the fans 46 are each circular in a plan view (when viewed in the direction of arrow A1), the back side stopper spring 72A, the front side stopper spring 72B, and the two projecting parts 76 are positioned near a top portion of the corresponding opening portion 54 shaped like a square. Further, the back side stopper spring 72A and the front side stopper spring 72B, and the two projecting parts 76 are diagonally positioned across the fans 46 in a plan view.

Operation of the present embodiment are described below.

As illustrated in FIG. 7, when the fans 46, the number of which is four in the example of the present embodiment, are driven in the state where all of the fan units 42, the number of which is two in the example of the present embodiment, are inserted in the fan unit insertion portion 36, wind that flows toward the board unit accommodation portion 38 (following wind) is generated.

The plurality of shutters 56 are coupled together by the coupling members 60 so as to correspond to one of the fans 46 and thus, pivot all together in the same manner.

The coupling member 60 has a certain mass and, in the state where no wind hits the shutters 56, applies rotating force that causes the shutters 56 to pivot in the opening direction (the direction of arrow H1) using the gravity that acts on the coupling member 60. Accordingly, when the fans 46 are driven, the wind from the downside (the following wind) hits the shutters 56 and thus, the shutters 56 receive the rotating force in the opening direction and the opening portion 54 may be opened with certainty.

As described above, rotating force in the opening direction (the direction of arrow H1) is applied to the shutters 56 through the weight member 66. Since in the present embodiment, the coupling member 60 serves as the weight member 66, the gravity that acts on the coupling member 60 may be effectively utilized and the rotating force in the opening direction may be applied to the plurality of shutters 56.

The weight member 66 may be separate from the coupling member 60 and, for example, one or more shutters, 56, may be provided with a weight member. When the coupling member 60 serves as the weight member 66 as in the present embodiment, an extra weight member is not necessary and no increase in the number of components may be caused.

In the back side shutter set 62A, when the shutters 56 are in the open position HP, the shutter 56 closest to the back wall 50A comes into contact with the back side contact segment 68A. Similarly, in the front side shutter set 62B, when the shutters 56 are in the open position HP, the shutter 56 closest to the front wall 50B comes into contact with the front side contact segment 68B. As described above, when part of the shutters 56 comes into contact with the back side contact segment 68A or the front side contact segment 68B, each shutter 56 is retained in the state of being inclined with respect to the flow direction of the returning wind from the board unit accommodation portion 38. The flow direction of the returning wind is indicated by the alternate long and short dashed lines F1.

The wind from the fans 46 passes through the opening portions 54 and reaches the inside of the electronic apparatus casing 34. After that, the wind cools (air-cools) the electronic components in the board unit accommodation portion 38. Although part of the wind that flows through the electronic apparatus casing 34 may be directed toward the opening portions 54 and return as the returning wind, in many cases, the wind flows out of the electronic apparatus casing 34 through the unillustrated air outlet that is positioned in the upper portion of the back face of the electronic apparatus casing 34.

As illustrated in FIG. 7, when being in the open position HP, the shutters 56 are inclined with respect to the direction of the returning wind, which is indicated by the alternate long and short dashed lines F1, and the opening portion 54 is open. Thus, while reducing pressure losses caused by the wind from the fans 46 (the following wind) hitting the shutters 56, wind may be sent into the electronic apparatus casing 34 with certainty.

Figure 8:
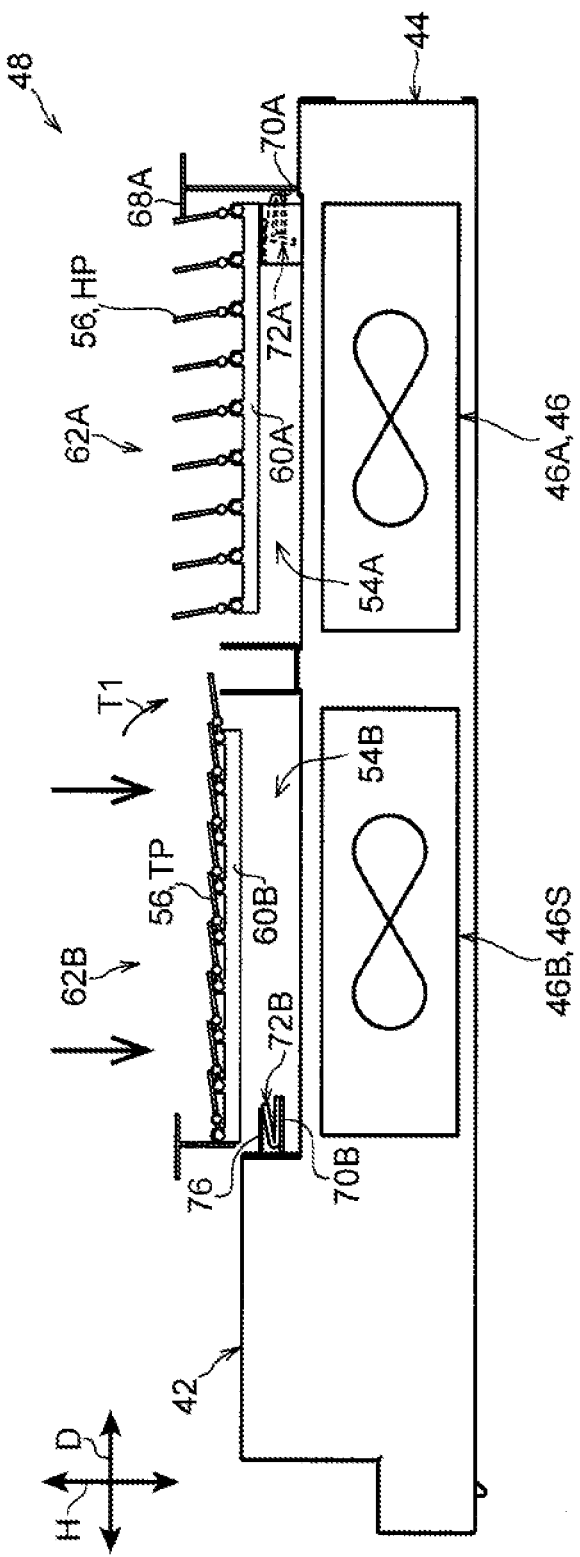
FIG. 8 is a side view that illustrates a state where, in the first embodiment, the fan unit is inserted in the electronic apparatus casing while a back side fan is driven and a front side fan is stationary.

It is now assumed that part of the plurality of fans 46 stops. For example, FIG. 8 illustrates a state where the front side fan 46B is stationary. Herein, the fan that has stopped may be referred to as the stationary fan 46S in particular. Even in the state where part of the fans is stationary, the electronic apparatus 32 retains the operating state and thus, the other fans 46 that are driven are used to continue the cooling of the electronic components.

Since the stationary fan 46S generates no wind, the shutters 56 of the shutter set corresponding to the stationary fan 46S, which is the front side shutter set 62B in the example illustrated in FIG. 8, receives no direct wind (no following wind) from the stationary fan 46S. Accordingly, the rotating force in the opening direction, which is caused by the hitting of the following wind, is no longer applied to the shutters 56. However, the returning wind from the electronic apparatus casing 34 hits the shutters 56 of the shutter set 62. Because of the inclination with respect to the direction of the returning wind, which is indicated by the alternate long and short dashed lines F1, each shutter 56 receives the rotating force in the closing direction (the direction of arrow T1) when hit by the returning wind.

In the shutter set 62 corresponding to the stationary fan 46S, the coupling member 60 has a mass that enables the shutters 56 to pivot in the closing direction by receiving the rotating force in the closing direction (the direction of arrow T1) caused by the returning wind. Accordingly, in the shutter set 62 corresponding to the stationary fan 46S, the shutters 56 hit by the returning wind pivot in the closing direction.

In each shutter set 62, the coupling member 60 allows the plurality of shutters 56 to pivot in the interlocking relationship with one another. Accordingly, in the shutter set 62, even when the returning wind that hits the shutters 56 has unevenness, all of the shutters 56 of the shutter set 62 pivot in the closing direction in the interlocking relationship with one another. Because of the returning wind, the shutters 56 of the shutter set 62 corresponding to the stationary fan 46S reaches the closed position.

As described above, even when the returning wind from the inside of the electronic apparatus casing 34 has unevenness, the shutters 56 corresponding to the stationary fan 46S may be closed securely. Accordingly, outflow of wind of the electronic apparatus casing 34 from the opening portion 54 corresponding to the stationary fan 46S may be inhibited. In the electronic apparatus casing 34, the state of cooling the electronic components may be retained by the wind from the fans 46 that are driven, which are the three fans 46 in the above-described example. For example, even when part of the fans 46 has stopped, it is not necessary to make the performance or number of the fans 46 excessively redundant so as to complement the outflow of the wind from the electronic apparatus casing 34.

Since in the closed position, the shutters 56 are in contact with the adjacent shutters 56, no further pivoting of the shutters 56 from the closed position occurs and the closed position may be retained.

The coupling members 60 are positioned so as to avoid the portions through which the wind from the fans 46 (the following wind) flows. Accordingly, it may be inhibited that the wind that flows into the electronic apparatus casing 34 from the fans 46 hits the coupling members 60 and is weakened.

While a case where certain one of the fans 46 has stopped is described above, another case is taken as an example below, where certain one of the fan units 42 is drawn from the fan unit insertion portion 36 for exchange, inspection, or the like of the fans 46.

When part of the plurality of fan units 42 is drawn from the fan unit insertion portion 36, the plurality of fans 46 installed in the drawn part of the fan units 42, which are two fans per fan unit in the present embodiment, are also drawn. Since even in the state where the plurality of fans 46 are drawn, the electronic apparatus 32 retains the operating state as described above, the cooling of the electronic components is continued with the fans 46 of the fan unit 42 that remains in the electronic apparatus casing 34.

Figure 6:
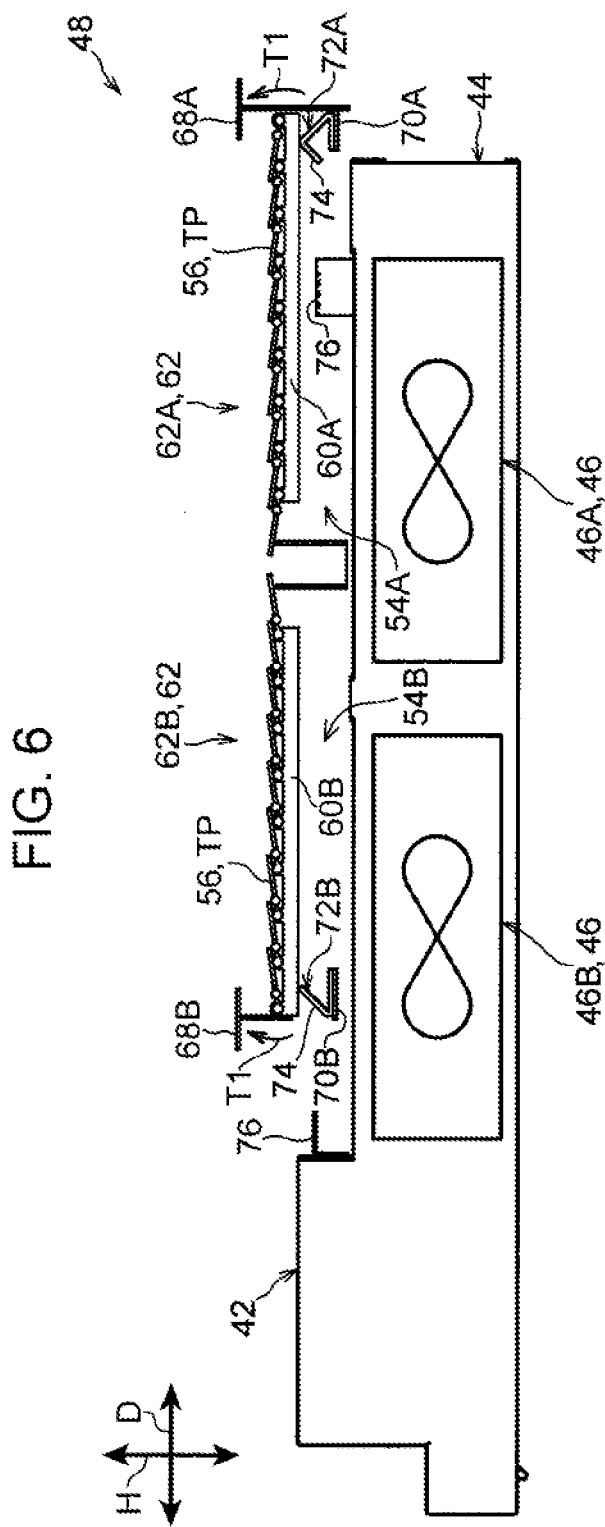
FIG. 6 is a side view that illustrates an incomplete state of drawing the fan unit from an electronic apparatus casing according to the first embodiment.

As illustrated in FIG. 6, when part of the fan units 42 is drawn from the fan unit insertion portion 36, the projecting parts 76 are separated from the back side stopper spring 72A and the front side stopper spring 72B. Accordingly, the back side stopper spring 72A and the front side stopper spring 72B exert spring force on the back side coupling member 60A and the front side coupling member 60B and press the back side coupling member 60A and the front side coupling member 60B in the closing direction (the direction of arrow T1), respectively. Then, the shutters 56 of the back side shutter set 62A pivot in the closing direction in the interlocking relationship with one another and take the closed position TP. Similarly, the shutters 56 of the front side shutter set 62B pivot in the closing direction (the direction of arrow T1) in the interlocking relationship with one another and take the closed position TP.

As described above, in the state where the fan unit 42 is (the plurality of fans 46 are) drawn from the fan unit insertion portion 36, the shutters 56 of the shutter sets 62 corresponding to the plurality of fans 46 that are drawn may be retained in the closed position TP. When the fan unit 42 including the plurality of fans 46 is drawn, a state substantially the same as the state where the plurality of fans 46 are stationary is caused and thus, compared to the state where one of the fans 46 is stationary, the load of retaining the cooling performance of the electronic apparatus is heavy for the other fans 46 in operation.

Also in such a case, in the present embodiment, the shutters 56 of the shutter sets 62 corresponding to the plurality of fans 46 that are drawn pivot to the closed position TP. Outflow of wind of the electronic apparatus casing 34 from the opening portions 54 corresponding to the drawn fans 46 may be suppressed. Thus, in the electronic apparatus casing 34, the wind (the following wind) from the two fans 46 driven in the above-described example in the electronic apparatus casing 34 may retain the cooling performance for the electronic components. That is, it is not necessary to make the performance (wind pressure) or number of the fans 46 excessively redundant so as to ensure the cooling performance in a case where the fan unit 42 is drawn.

In the state where the fan unit 42 is drawn from the fan unit insertion portion 36, the elastic force of the stopper springs 72 urges the shutters 56 of the shutter set 62 in the closing direction. In this state, the shutters 56 come into contact with the adjacent shutters 56 and are retained in the closed position TP accordingly. That is, each of the shutters 56 is fixed in the closed position TP. Thus, even when vibration or impact is exerted during transportation or the like on the electronic apparatus casing 34 in the state where the fan unit 42 is drawn out, accidental pivoting of the shutters 56 or the coupling members 60 may be inhibited and damage to the shutters 56 or the coupling members 60 may be suppressed.

The back side stopper spring 72A and the front side stopper spring 72B are examples of the spring member, with which the electronic apparatus casing 34 is provided in the present embodiment. As described above, a simple structure employing the spring members enables the shutters 56 of the shutter sets 62 corresponding to the plurality of fans 46 that are drawn to be retained in the closed position TP.

The spring member is not limited to the plate spring such as the back side stopper spring 72A or the front side stopper spring 72B described above, and may be a coil spring for example. When a plate spring is used as the spring member, the structure of the spring member may be simplified.

Each stopper spring 72 includes the tapered face 74. Before the fan unit 42 is completely inserted into the fan unit insertion portion 36, the projecting parts 76 come into contact with the tapered faces 74 to press the stopper springs 72 from the upside, and the stopper springs 72 are separated from the back side coupling member 60A and the front side coupling member 60B. As described above, the act of inserting the fan unit 42 into the fan unit insertion portion 36 may easily create the state where neither the spring force of the back side stopper spring 72A nor the spring force of the front side stopper spring 72B is exerted on the coupling members 60.

In the state where the fan unit 42 is inserted in the fan unit insertion portion 36, the back side stopper spring 72A and the front side stopper spring 72B are separated from the corresponding back side coupling member 60A and the corresponding front side coupling member 60B, and no spring force is exerted.

The projecting part 76 is an example of the separation member with which the unit frame 44 (the fan casing) is provided. An extra member for providing the separation member is not necessary and no increase in the number of components may be caused.

In the state where the fan unit 42 is inserted in the fan unit insertion portion 36, the back side stopper spring 72A and the front side stopper spring 72B are positioned so as to avoid the portion through which the wind from the fans 46 (the following wind) flows. Similarly, the projecting parts 76 are positioned so as to avoid the portion through which the wind from the fans 46 (the following wind) flows. Thus, unfavorable results brought by the wind that flows from the fans 46 into the electronic apparatus casing 34 hitting the back side stopper spring 72A, the front side stopper spring 72B, and the projecting parts 76 may be reduced.

A second embodiment is described below. In the second embodiment, the same references are given to elements, members, and the like similar to those in the first embodiment and detailed descriptions thereof are omitted.

Figure 9:
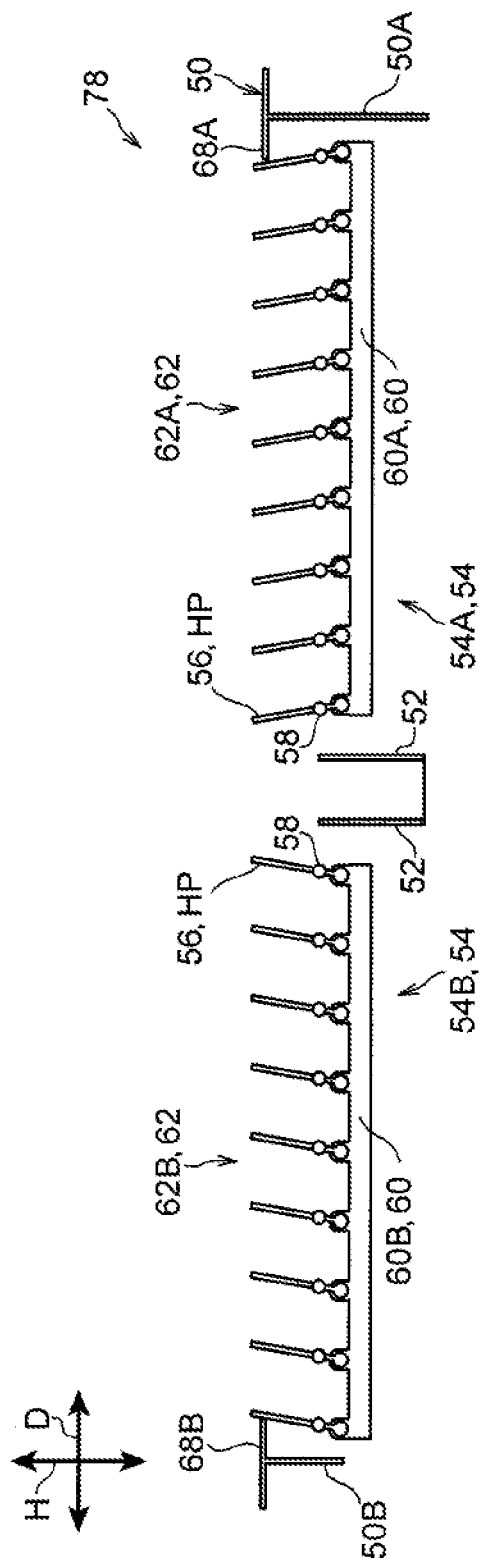
FIG. 9 is a side view that illustrates a shutter unit according to a second embodiment in an open position of shutters.

As illustrated in FIG. 9, the back side stopper spring 72A, the front side stopper spring 72B, and the projecting parts 76 (see FIGS. 4 and 5) are not included in a shutter unit 78 according to the second embodiment. That is, in the second embodiment, the back side stopper spring 72A, the front side stopper spring 72B, and the projecting parts 76 are omitted and thus, the shutter unit 78 may have a simplified structure and a reduced weight.

Figure 10:
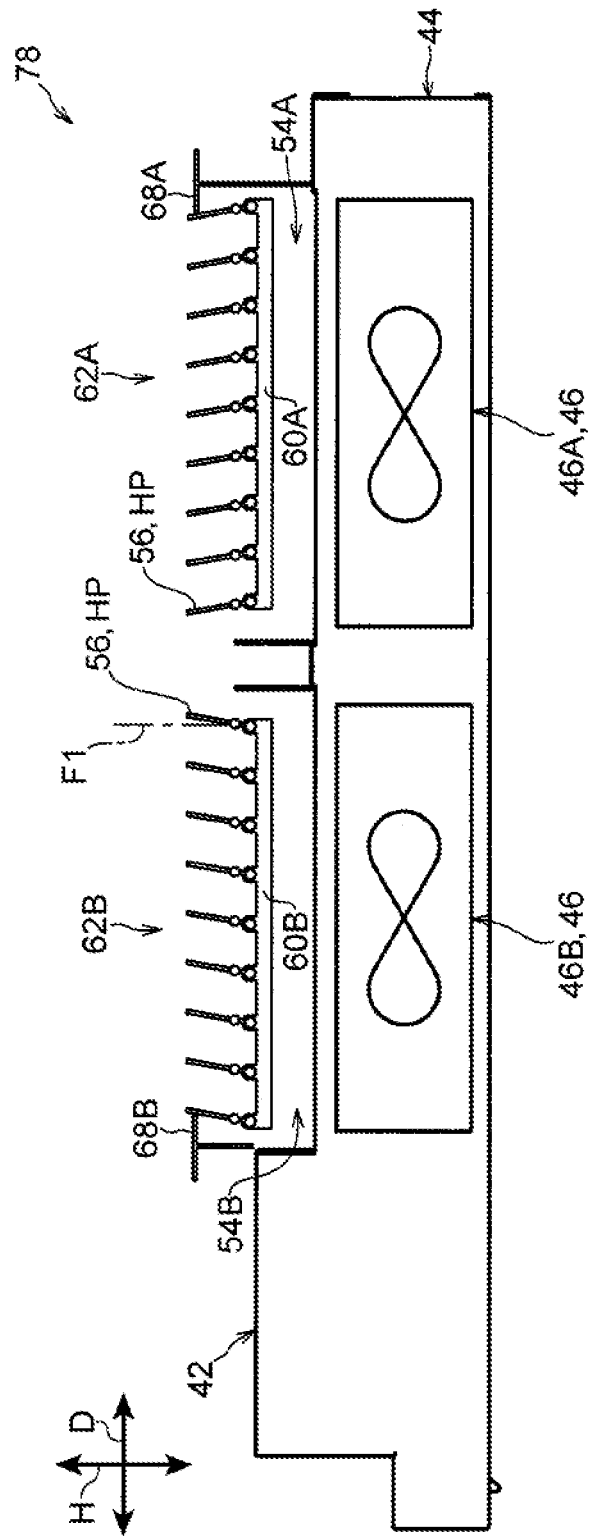
FIG. 10 is a side view that illustrates a state where, in the second embodiment, a fan unit is inserted in an electronic apparatus casing and fans are driven.

Also in the shutter unit 78 according to the second embodiment, when all of fans 46 are driven, shutters 56 are in an open position HP as illustrated in FIG. 10. The wind from the fans 46 passes through opening portions 54 and cools (air-cools) electronic components in an electronic apparatus casing 34.

Figure 11:
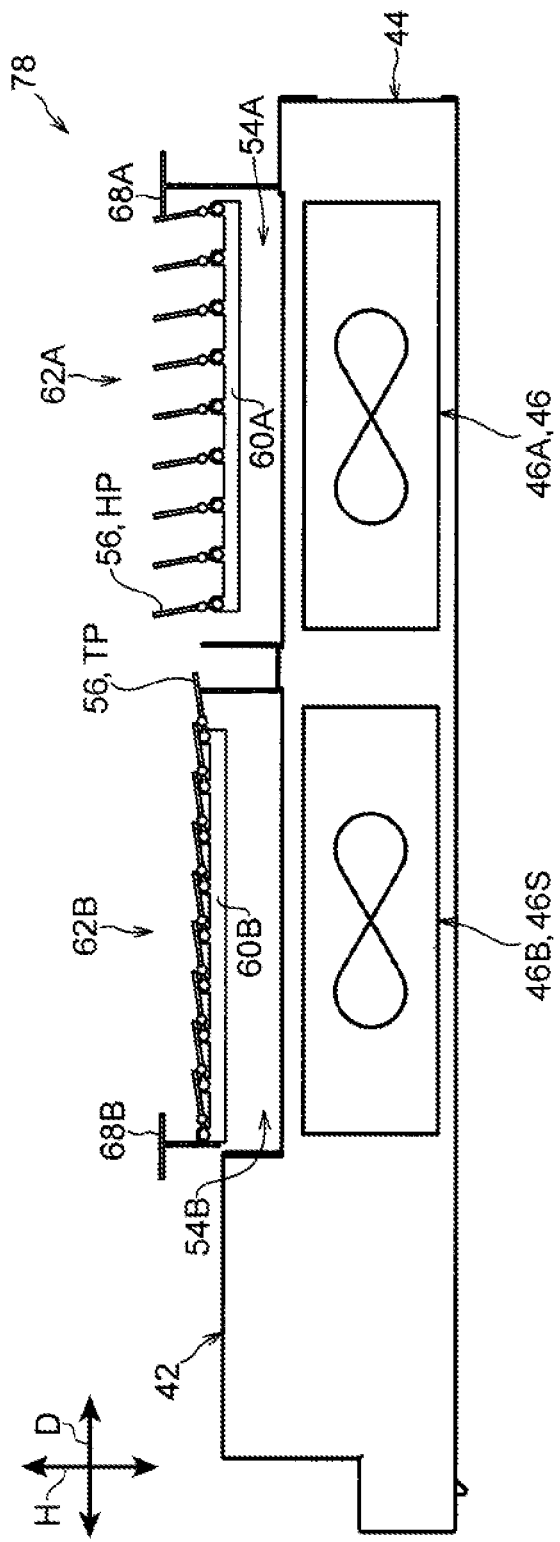
FIG. 11 is a side view that illustrates a state where, in the second embodiment, the fan unit is inserted in the electronic apparatus casing while a back side fan is driven and a front side fan is stationary.

In the shutter unit 78 according to the second embodiment, the shutters 56 in the open position HP are inclined with respect to the direction of returning wind, which is indicated by alternate long and short dashed lines F1. Accordingly, when part of the fans 46 has stopped, the shutters 56 of a shutter set 62 corresponding to a stationary fan 46S, which is a front side shutter set 62B in the example illustrated in FIG. 11, receives the returning wind. Since the shutters 56 of the shutter set 62 are coupled together by a coupling member 60, even when the returning wind that hits the shutters 56 has unevenness, all of the shutters 56 of the shutter set 62 pivot in the closing direction in the interlocking relationship with one another and reaches a closed position TP.

Figure 12:
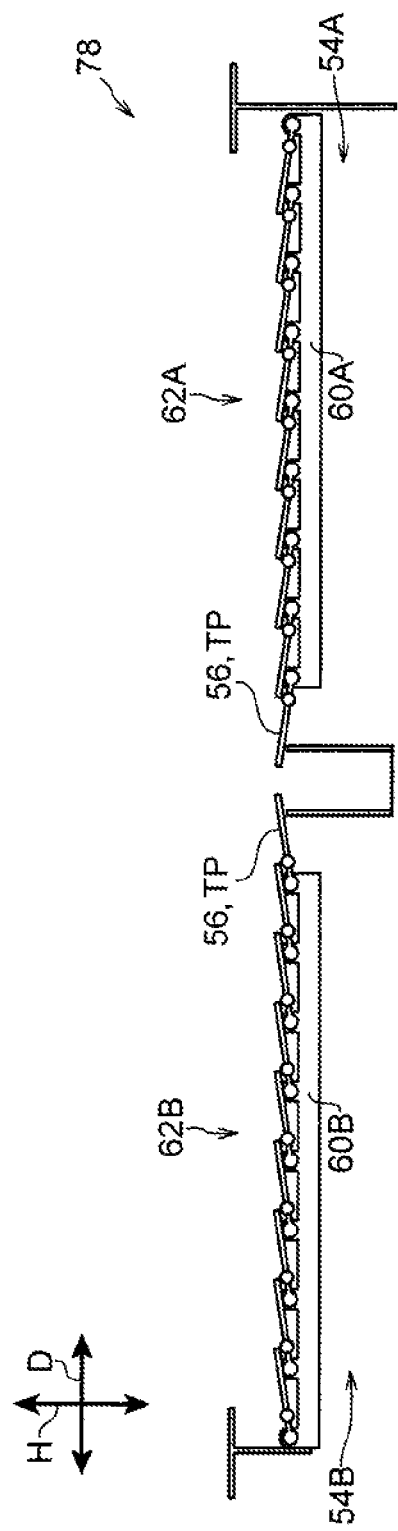
FIG. 12 is a side view that illustrates a state where, in the second embodiment, part of the fan units is drawn from the electronic apparatus casing.

In the second embodiment, when a fan unit 42 is drawn out of a fan unit insertion portion 36, wind from the fans 46 of the fan units 42 that remain in the fan unit insertion portion 36 is sent into the electronic apparatus casing 34. The mass of the coupling member 60 is set so that, when the returning wind from the inside of the electronic apparatus casing 34 hits the shutters 56 corresponding to the portion where the fan unit 42 is drawn, the shutters 56 of the shutter sets 62 receive the returning wind and pivot in the closing direction as illustrated in FIG. 12.

Accordingly, in the second embodiment, in the state where the fan unit 42 is drawn out of the fan unit insertion portion 36, the returning wind that hits the shutters 56 corresponding to the drawn portion of the fan unit 42 may cause the shutters 56 to pivot in the closing direction.

A third embodiment is described below. In the third embodiment, the same references are given to elements, members, and the like similar to those in the first or second embodiment and detailed descriptions thereof are omitted.

Figure 13:
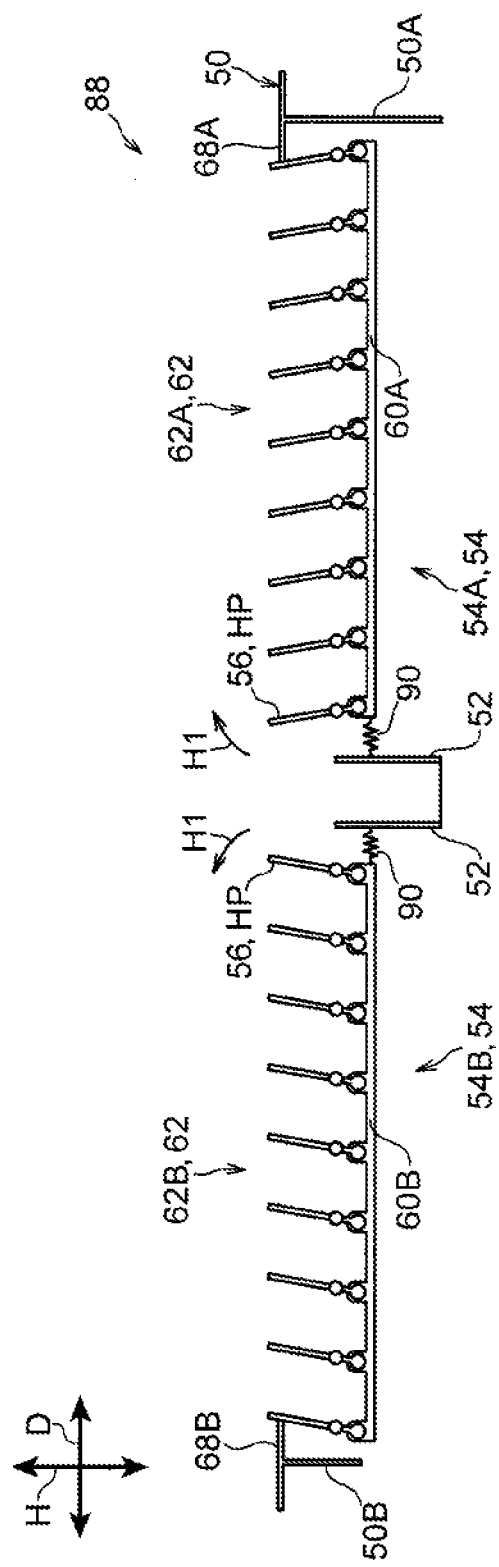
FIG. 13 is a side view that illustrates a shutter unit according to a third embodiment in an open position of shutters.

As illustrated in FIG. 13, in a shutter unit 88 according to the third embodiment, opening direction springs 90 are attached to coupling members 60 and partition walls 52. The opening direction springs 90 exert rotating force (elastic force) in opening directions on shutter sets 62 via the coupling members 60.

Thus, no weight member is not necessary in the third embodiment. Since the coupling member 60 does not serve as a weight member, flexibility in the shape or arrangement of the coupling member 60 is high. In addition, the rotating force in the opening direction to be exerted on the shutter set 62 may be adjusted easily by replacing the opening direction spring 90 and changing the elastic force.

As an example in which the opening direction springs 90 are provided, FIG. 13 illustrates a structure where, similar to the second embodiment, the back side stopper spring 72A, the front side stopper spring 72B, and the projecting parts 76 (see FIGS. 4 and 5) are not included. Instead of the structure, similar to the first embodiment, a structure including the back side stopper spring 72A, the front side stopper spring 72B, and the projecting parts 76 may be employed.

In the third embodiment, the opening direction spring 90 may be structured so as to exert the spring force on the shutters 56 instead of exerting the spring force on the coupling member 60. Further, the opening direction springs 90 may be provided to portions other than the partition walls 52 in a frame body 50.

A fourth embodiment is described below. In the fourth embodiment, the same references are given to elements, members, and the like similar to those in the first to third embodiments and detailed descriptions thereof are omitted.

In a shutter unit 98 according to the fourth embodiment, a fan unit 42 is vertically arranged. A plurality of fans 46 that are installed in the fan unit 42 are arranged beside each other in the height direction.

In the fourth embodiment, shutter sets 62 are also vertically arranged beside each other so as to correspond to the plurality of fans 46 arranged beside each other in the height direction. A coupling member 60 that couples shutters 56 of the shutter set 62 together serves as a weight member 66. The gravity that acts on the coupling member 60 (the weight member 66) causes rotating force in an opening direction to be exerted on the shutters 56.

Each of the shutters 56 is inclined with respect to the direction of returning wind from an electronic apparatus casing 34. When part of the fans 46 is stationary, the returning wind hits the shutters 56 of the shutter set 62 corresponding to a stationary fan 46S and the shutters 56 may pivot in a closing direction in the interlocking relationship with one another. That is, even when the returning wind has unevenness, the shutters 56 of the shutter set 62 corresponding to the stationary fan 46S may be securely closed.

Figure 14:
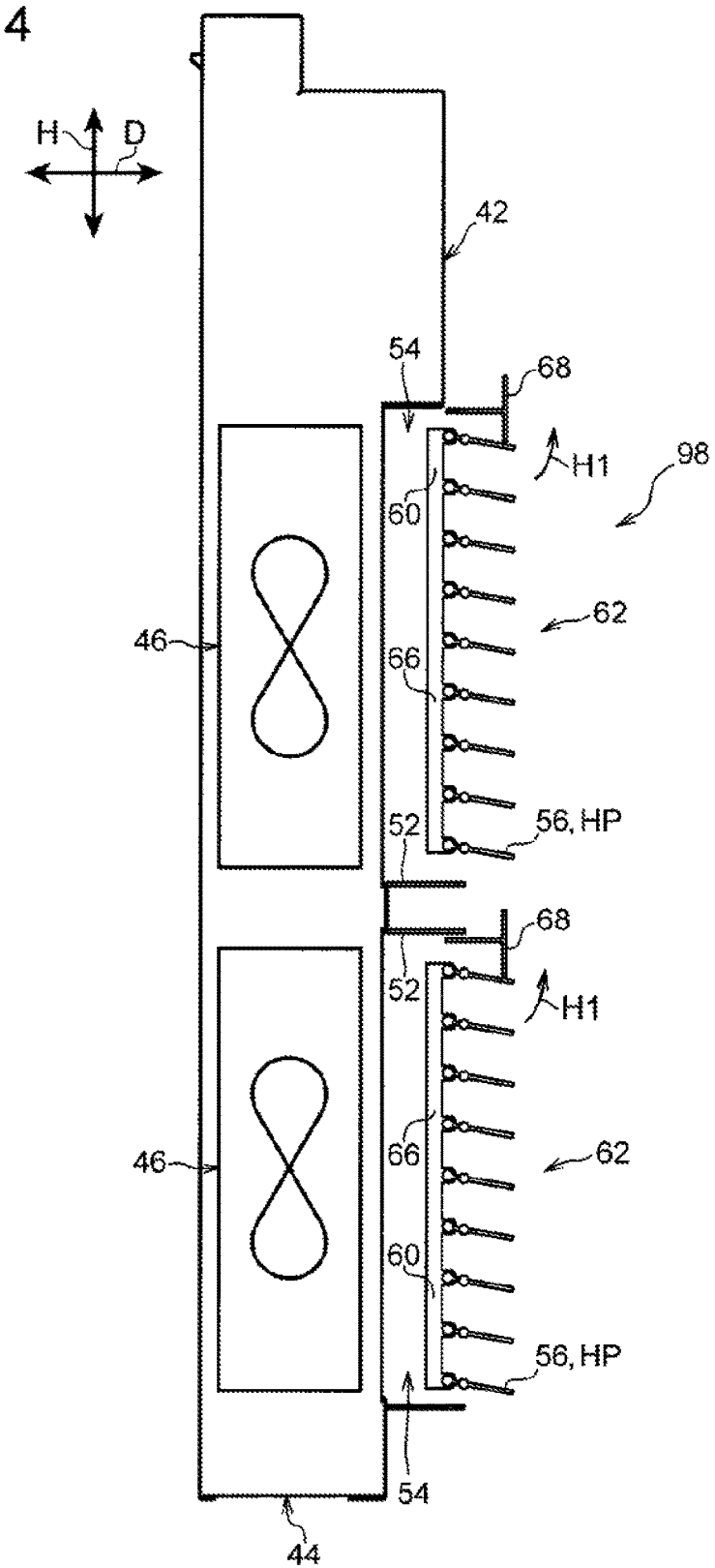
FIG. 14 is a side view that illustrates a shutter unit according to a fourth embodiment in an open position of shutters.

As an example in which the fan unit 42 is arranged in the vertical direction, FIG. 14 illustrates a structure where, similar to the second embodiment, the stopper springs 72 and the projecting parts 76 (see FIGS. 4 and 5) are not included. Instead of the structure, similar to the first embodiment, a structure including the stopper springs 72 and the projecting parts 76 may be employed. Further, similar to the third embodiment, a structure including the opening direction springs 90 may also be employed.

Figure 15:
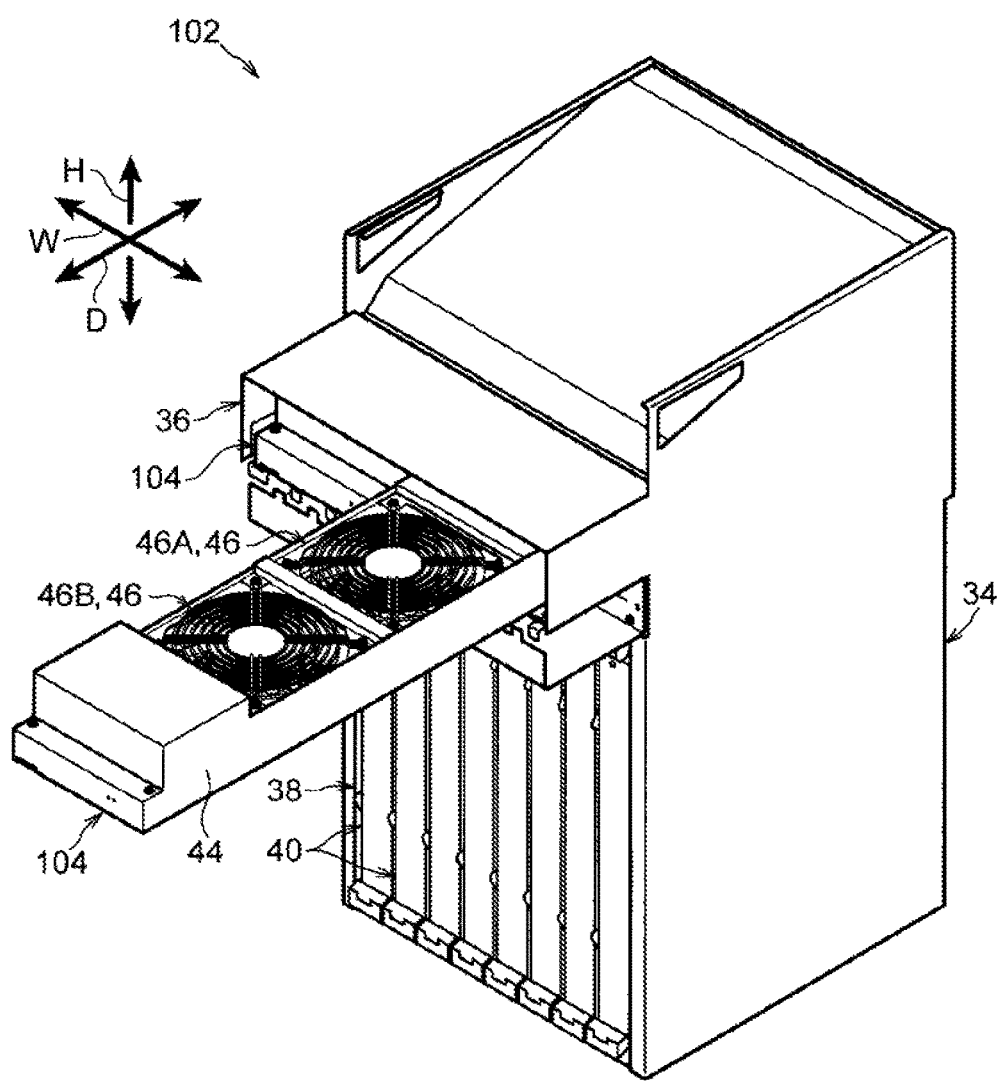
FIG. 15 is a perspective view that illustrates an electronic apparatus according to a fifth embodiment.

A fifth embodiment is described below. In the fifth embodiment, the same references are given to elements, members, and the like similar to those in the first to fourth embodiments and detailed descriptions thereof are omitted. As illustrated in FIG. 15, in an electronic apparatus 102 according to the fifth embodiment, a fan unit insertion portion 36 is located in an upper portion of an electronic apparatus casing 34. In other words, in the fifth embodiment, fan units 104 are provided over a board unit accommodation portion 38.

In the fifth embodiment, wind caused by the fan units 104 flows in an upward direction. That is, the fan units 104 (fans 46) are positioned on the side to which air flows out from the board unit accommodation portion 38. In this regard, the fan 46 according to the fifth embodiment may be referred to as an exhaust fan.

In the fan unit 104 according to the fifth embodiment, a shutter unit 78 is arranged on the windward side of the fans 46.

Figure 16:
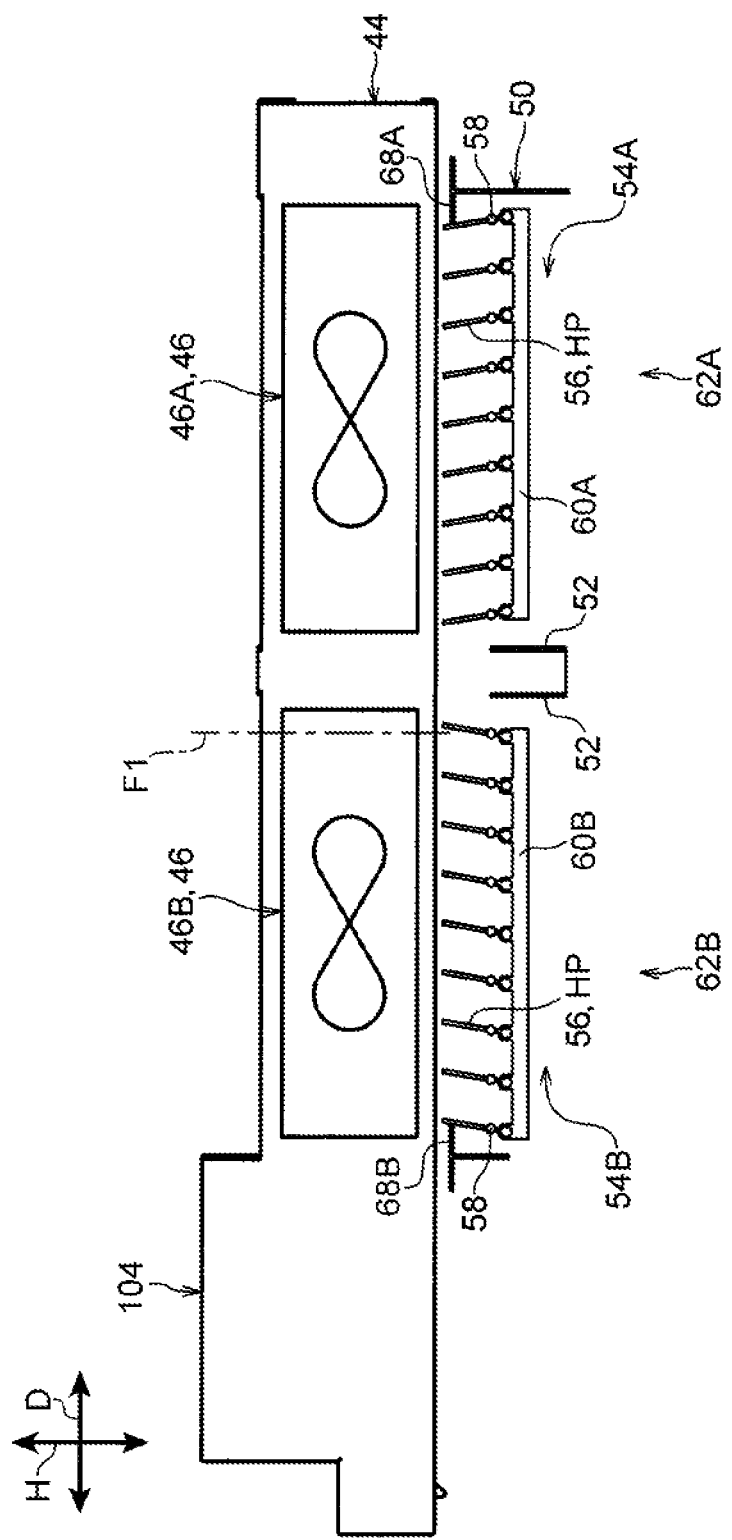
FIG. 16 is a side view that illustrates a state where, in the fifth embodiment, a fan unit is inserted in an electronic apparatus casing and fans are driven.

Also in the fifth embodiment, when all of the fans 46 are driven, shutters 56 are in an open position HP, which is the state illustrated in FIG. 16. The wind from the fans 46 passes through opening portions 54 and cools (air-cools) electronic components in the electronic apparatus casing 34.

In the fifth embodiment, when the shutters 56 are positioned in the closed position TP, returning wind flows downward through the portion of the fan 46 corresponding to the shutters 56 that are in the open position HP so as to detour. Accordingly, when part of the fans 46 has stopped, the shutters 56 of a shutter set 62 corresponding to a stationary fan 46S, which is a front side shutter set 62B in the example illustrated in FIG. 17, receive the returning wind. Since the shutters 56 of the shutter set 62 are coupled together by a coupling member 60, even when the returning wind that hits the shutters 56 has unevenness, all of the shutters 56 of the shutter set 62 pivot in the closing direction in the interlocking relationship with one another and reach a closed position TP.

The fifth embodiment offers an example of a structure where the fan unit 104 is arranged on the side where air flows out from the board unit accommodation portion 38, which is also, from another viewpoint, an example of a structure where the shutter unit 78 is arranged on the windward side of the fans 46.

As described above, the application example of the structure where the shutter unit 78 is arranged on the windward side of the fans 46 is not limited to the structure where the fan unit 104 is arranged on the side where air flows out from the board unit accommodation portion 38 (the structure where the fan 46 is an exhaust fan). For example, similar to the first embodiment or the second embodiment, in the structure where the fan units are arranged on the side where air flows into the board unit accommodation portion 38 (the structure where the fan 46 is an air intake fan), the shutter unit 78 may be arranged on the windward side of the fans 46.

Figure 17:
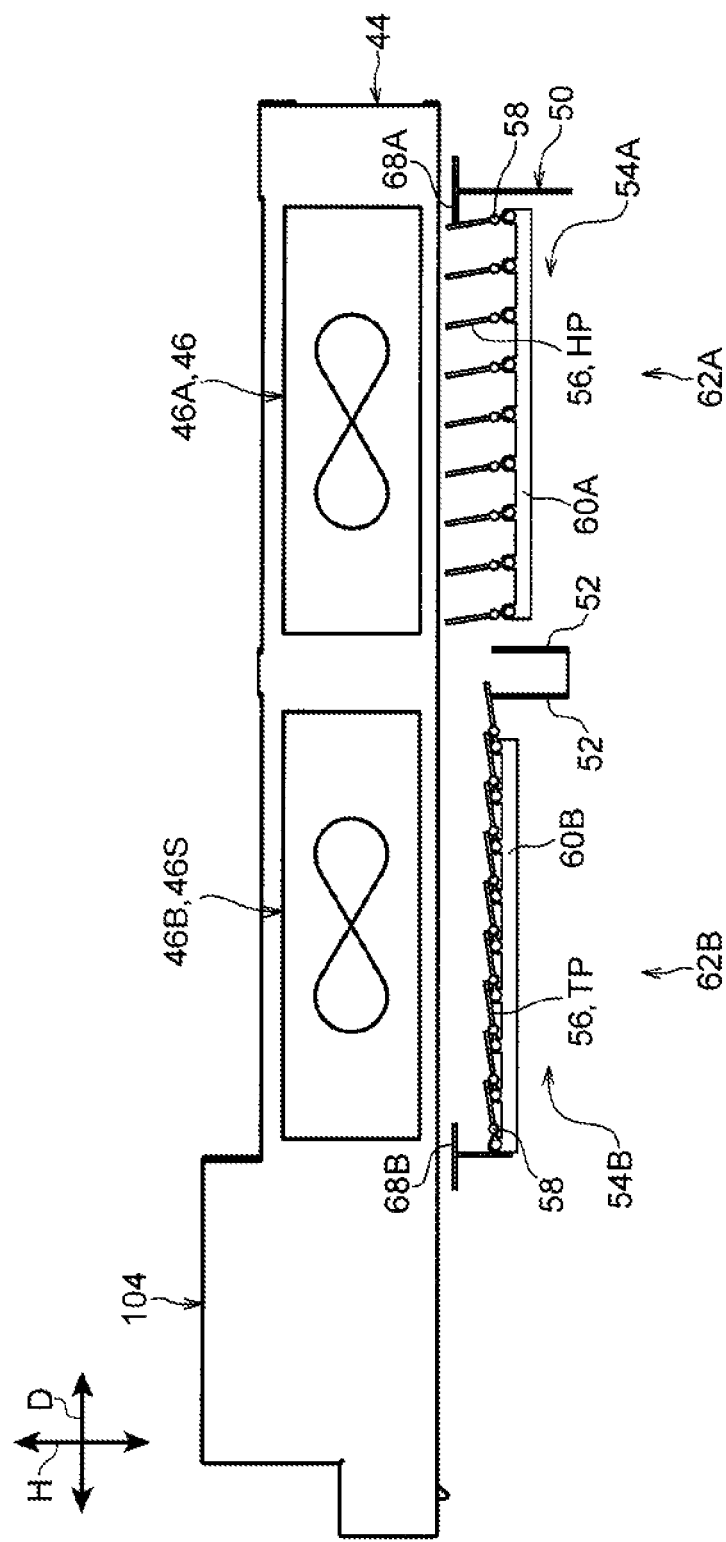
FIG. 17 is a side view that illustrates a state where, in the fifth embodiment, the fan unit is inserted in the electronic apparatus casing while a back side fan is driven and a front side fan is stationary.

In the examples illustrated in FIGS. 16 and 17, the illustration of the back side stopper spring 72A and the front side stopper spring 72B (see, for example, FIGS. 4 and 5) is omitted. In the fifth embodiment, the back side stopper spring 72A and the front side stopper spring 72B may be provided as in the first embodiment, or the back side stopper spring 72A and the front side stopper spring 72B may be omitted as in the second embodiment.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A shutter unit comprising:
a plurality of shutters, provided in a frame body, that are grouped into groups corresponding to one of a plurality of fans, the groups being arranged side by side in a depth direction of the frame body and positioned on a leeward side or a windward side of the corresponding one of the plurality of fans, grouped shutters of the respective groups being capable of pivoting between an open position and a closed position, the plurality of fans being for sending wind to an inside of an electronic apparatus casing;
coupling members each that couples the grouped shutters of the respective groups together so that the grouped shutters are pivotable, one of the coupling members being provided on one side in a width direction of the frame body perpendicular to the depth direction and the other of the coupling members being provided on the other side in the width direction; and
an abutment member that retains the grouped shutters of the respective groups in a state of being in the open position and inclined with respect to a flow direction of returning wind returning from the inside of the electronic apparatus casing toward a side of the plurality of fans,
wherein the abutment member includes pivoting stopping members each which is provided for the respective groups, is arranged at one end of the respective coupling members opposite to a position in which an opening of the grouped shutters of the respective groups starts and stops the grouped shutters of the respective groups from pivoting in an opening direction by being in contact with one shutter of the grouped shutters of the respective groups provided at a nearest position to the one end,
wherein the shutter unit further includes spring members each that presses the grouped shutters of the respective groups or the respective coupling members and causes the grouped shutters of the respective groups to pivot in a closing direction toward the closed position, is provided under the respective stopping members,
wherein the one of the spring members for the one of the coupling members is provided on the one side in the width direction and on one side in the depth direction and the other of the spring members for the other of the coupling members is provided on the other side in the width direction and on the other side in the depth direction wherein the coupling members apply rotating force in the opening direction to the grouped shutters of the respective groups, the rotating force being generated by gravity.

2. The shutter unit according to claim 1, wherein the coupling members include a first coupling member and a second coupling member which are arranged in the depth direction and an opening direction of the grouped shutters of the first coupling member is opposite to an opening direction of the grouped shutters of the second coupling member.

3. The shutter unit according to claim 1, wherein the abutment member includes an elastic member that exerts elastic force on the respective coupling members or the grouped shutters of the respective groups and applies rotating force in the opening direction to the grouped shutters of the respective groups.

4. The shutter unit according to claim 1, wherein when the corresponding one of the plurality of fans is stationary, the rotating force in the opening direction is smaller than rotating force which is caused by the returning wind against the grouped shutters of the respective groups and acts in a closing direction toward the closed position of the grouped shutters of the respective groups.

5. The shutter unit according to claim 1, wherein the rotating force in the opening direction has magnitude that causes the grouped shutters of the respective groups to pivot in the opening direction in a state where no wind hits the grouped shutters of the respective groups.

6. The shutter unit according to claim 1, wherein when the grouped shutters of the respective groups are in the closed position, the grouped shutters of the respective groups are each in contact with adjacent one of the grouped shutters and stopped from pivoting in a closing direction.

7. The shutter unit according to claim 1, wherein each of the coupling members is positioned so as to avoid a passage of wind from the corresponding one of the plurality of fans.

8. The shutter unit according to claim 1, wherein the spring members are a plate spring.

9. The shutter unit according to claim 1, wherein the spring members include a tapered face upward in the depth direction.

10. An electronic apparatus comprising:
an electronic apparatus casing in which an electronic component is installed;
a plurality of fans that send wind to an inside of the electronic apparatus casing; a plurality of shutters, provided in a frame body, that are grouped into groups corresponding to one of the plurality of fans, the groups being arranged side by side in a depth direction of the frame body and positioned on a leeward side or a windward side of the corresponding one of the plurality of fans, grouped shutters of the respective groups being capable of pivoting between an open position and a closed position, the plurality of fans being for sending wind to an inside of an electronic apparatus casing;
coupling members each that couples the grouped shutters of the respective groups together so that the grouped shutters are pivotable, one of the coupling members being provided on one side in a width direction of the frame body perpendicular to the depth direction and the other of the coupling members being provided on the other side in the width direction; and
an abutment member that retains the grouped shutters of the respective groups in a state of being in the open position and inclined with respect to a flow direction of returning wind returning from the inside of the electronic apparatus casing toward a side of the plurality of fans,
wherein the abutment member includes pivoting stopping members each which is provided for the respective groups, is arranged at one end of the respective coupling members opposite to a position in which an opening of the grouped shutters of the respective groups starts and stops the grouped shutters of the respective groups from pivoting in an opening direction by being in contact with one shutter of the grouped shutters of the respective groups provided at a nearest position to the one end,
wherein the shutter unit further includes spring members each that presses the grouped shutters of the respective groups or the respective coupling members and causes the grouped shutters of the respective groups to pivot in a closing direction toward the closed position, is provided under the respective stopping members,
wherein the one of the spring members for the one of the coupling members is provided on the one side in the width direction and on one side in the depth direction and the other of the spring members for the other of the coupling members is provided on the other side in the width direction and on the other side in the depth direction wherein the coupling members apply rotating force in the opening direction to the grouped shutters of the respective groups, the rotating force being generated by gravity.

11. The electronic apparatus according to claim 10, wherein the spring members are a plate spring.

12. The electronic apparatus according to claim 10, further comprising: a fan casing, which cases the plurality of fans and includes projecting parts for the respective fans that are in contact with the respective spring members.

13. The electronic apparatus according to claim 12, wherein each of the coupling members is positioned so as to avoid a passage of wind from the corresponding one of the plurality of fans.

14. The electronic apparatus according to claim 12, wherein the spring members include a tapered face upward in the depth direction.

* * * * *